United States Patent
Wagganer

[19]

[11] Patent Number: 6,146,986
[45] Date of Patent: Nov. 14, 2000

[54] LITHOGRAPHIC METHOD FOR CREATING DAMASCENE METALLIZATION LAYERS

[75] Inventor: Eric D. Wagganer, Milpitas, Calif.

[73] Assignee: Lam Research Corporation, Fremont, Calif.

[21] Appl. No.: 09/227,222

[22] Filed: Jan. 8, 1999

[51] Int. Cl.$^7$ .............................................. H01L 21/4763
[52] U.S. Cl. .................... 438/618; 438/424; 438/314; 438/968; 438/622; 257/330
[58] Field of Search .................... 438/618, 424, 438/314, 622, 968; 257/330

[56] References Cited

U.S. PATENT DOCUMENTS

| | | | |
|---|---|---|---|
| 5,516,625 | 5/1996 | McNamara et al. | 430/314 |
| 5,736,457 | 4/1998 | Zhao . | |
| 5,945,707 | 8/1999 | Bronner et al. | 257/330 |
| 5,963,818 | 10/1999 | Kao et al. | 438/424 |

OTHER PUBLICATIONS

Klawuhn et al., "Integration Of Cu Electroplating Technology With Physical Vapor Deposition Of Ta And Cu Layers Using A Hollow Cathode Magnetron Plasma Source" Novellus Systems, Inc., 3011 North First Sreet, San Jose, CA 95134.

*Primary Examiner*—Richard Elms
*Assistant Examiner*—Pho Luu
*Attorney, Agent, or Firm*—Beyer Weaver & Thomas, LLP

[57] ABSTRACT

An improved method of forming a metallization layer in a layer stack is disclosed. In one aspect of the invention, a method of performing a lithographic damascene etch on a layer stack to form a metal line is disclosed. The layer stack, which is disposed above a substrate, is comprised of an underlying layer. The method of performing the lithographic damascene etch comprises the steps of depositing a photoresist layer above the layer stack and forming a trench in the photoresist layer so that the trench is positioned over the underlying layer of the layer stack. The method continues with depositing a metal layer over the top surface of the photoresist layer and filling the trench, planarizing the metal layer down to about a level of the top surface of the photoresist layer to define a top surface of a metal line, and removing the photoresist layer to leave gaps around the metal line. A dielectric material is then deposited to fill the gaps around the metal line up to a level of about the top surface of the metal line.

52 Claims, 10 Drawing Sheets

LITHOGRAPHIC METHOD FOR CREATING DAMASCENE METALLIZATION LAYERS

BACKGROUND OF THE INVENTION

The present invention relates to semiconductor devices and more particularly, to improved methods of forming damascene metallization layers by utilization of lithographic techniques.

Semiconductor manufacturers must continually improve the power and performance of semiconductor devices while keeping the device size to a minimum. In an effort to maintain a small device size, most semiconductor manufacturers reduce individual components of the device to minimal dimensions. Furthermore, manufacturers are using methods such as vertical integration of the components, to reduce the device area consumed by the components. But by packing the components in a higher and higher density, the need for higher performance interconnects arises. As the cross sectional areas of the interconnects shrinks, line resistance and current density capacity become limiting factors of total chip performance. For example, aluminum, which has commonly been used for interconnects, has problems associated with electromigration and lowered heat dissipation. Copper, which has a lower resistivity and a greater electromigration lifetime, eliminates many of the existing problems associated with using aluminum. However, there are difficulties with fabricating copper interconnects using conventional etching techniques since copper material does not lend itself well to conventional plasma etching.

A recent approach to solving the problem of interconnecting the various conductive layers involves etch and mask sequences generally known in the art as damascene techniques. The damascene technique involves forming a plurality of trenches in a layer of insulator and subsequently filling them with metal, by way of example, copper, which is then polished down to the surface of the insulator to form the desired metal pattern. In a process generally known as dual damascening, both the metal trenches as described above and the via interconnects electrically connecting the aforementioned metal pattern and various other conductive layers are typically filled substantially simultaneously.

Figure 1:
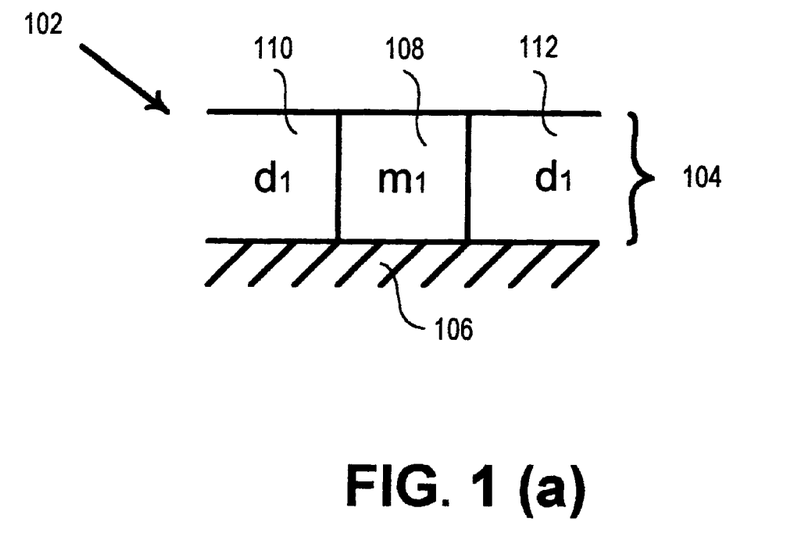
FIGS. 1(a), 1(b), 1(c), 1(d), 1(e), 1(f) and 1(g) illustrate a process flow for forming a metallization layer using damascene techniques known in the prior art.

By way of example, FIGS. 1(a), 1(b), 1(c), 1(d), 1(e), 1(f) and 1(g) illustrate a process flow for forming a metallization layer using standard damascene techniques known in the prior art. FIG. 1(a) shows a layer stack 102 having a metal one layer 104 disposed above a substrate 106. A metal one region 108 may be a line or a via or a chain of vias in metal one layer 104. Dielectric regions 110 and 112 insulate metal one region 108 from other metal lines or vias. Though it is not shown in the figures, layer stack 102 may represent a layer within a series of layers and substrate 106 may have various processing and/or device layers disposed underneath.

FIG. 1(b) shows a dielectric layer 114 deposited above metal one layer 104. Dielectric layer 114 is usually deposited using a blanket deposition method, for example, or some type of chemical vapor deposition. Dielectric layer 114 usually comprises some type of insulating material, by way of example, a low-K dielectric.

FIG. 1(c) shows a photoresist layer 116 that is formed above dielectric layer 114. Photoresist layer 116 has been patterned using a conventional photolithography process to provide an opening 118. The process flow continues with the etching into dielectric layer 114 through opening 118, extending the depth of opening 118 through dielectric layer 114 such that metal one region 108 is exposed as shown in FIG. 1(d).

FIG. 1(e) illustrates the layer stack after photoresist layer 116 has been removed, typically by an ash process. After removal of the photoresist, a metal two layer 120 is deposited into opening 118 to make contact with metal one region 108 underneath and over dielectric layer 114 as shown in FIG. 1(f). Metal two layer 120 may be deposited by a number of methods, depending on the specific metal being used. If metal two layer 120 is aluminum, chemical vapor deposition or sputtering might be used. A copper metal two layer 120 might be depositing by electroplating, sputtering or other methods such as a blanket type of deposition that is commonly used for depositing metallic materials. Prior to deposition of metal two layer 120, an optional barrier layer (not shown in the figures to simplify the illustration) may be deposited over the surface of opening 118 if necessary, for example, to prevent the diffusion of metal into the dielectric material. This barrier layer, which is generally used with copper deposition may be, by way of example, tantalum nitride.

After deposition into opening 118 and over dielectric layer 114, metal two layer 120 is planarized down to the top of the dielectric material, leaving a metal line 122 in contact with metal one region 108 as shown in FIG. 1(g). Planarizing may be achieved by chemical-mechanical polishing, among other planarization techniques. In using the chemical mechanical polishing method, there may be an polish stop layer disposed above dielectric layer 114 (not shown in the figure to simplify the discussion).

The standard damascene approach described in the above figures has been used successfully to form metallization layers of metals that are not easily etchable, such as copper. But as device scaling progresses further and the smaller metal lines come closer and closer together, regular dielectric materials can not perform their insulating functions in a satisfactory manner, thereby resulting in cross-talking and short circuits. This gives rise to a need for better insulating materials, for example, low-K dielectric materials. However, utilizing these next generation materials such as the low-K dielectric materials in standard damascene techniques poses difficult challenges, primarily in etching the low-K dielectric material and in depositing metal on the low-K dielectric layer.

Material porosity is a major issue as these next generation materials such as the low-K dielectrics have a low dielectric constant, usually about 3 or less (with the absolute lowest k being a vacuum, which is equivalent to k=1). One way the dielectric constant can be decreased is by decreasing the density of the material, which will result in materials of greater porosity. Due to the discontinuity of the material surfaces, these dielectric materials of greater porosity pose serious problems in metal deposition, and in the case of copper, deposition of a barrier layer in addition to copper. There may be difficulties in attempting to deposit a continuous barrier layer or metal layer over a bumpy or irregular surface of the dielectric layer.

Another problem is the mechanical strength of these next generation materials, which raises concerns about their ability to withstand rigorous processes such as chemical mechanical polishing. By way of example, to accomplish the chemical mechanical polishing of metal two layer 120 in FIG. 1(f) down to the top of dielectric layer 114, dielectric layer 114 must be better able to mechanically withstand the chemical mechanical polishing process than present day low-K dielectric materials are known to be. A dielectric layer made of a material that does not have the mechanical strength to withstand the chemical mechanical polishing process may result in a shifting of the trenches that define the metal lines, as well as a lack of structural integrity on the part of the dielectric layer rendering it ineffective as an insulator. Moreover, it may be difficult to maintain a flat planar level on the top surface of dielectric layer which is conducive towards metal deposition. The interaction of the dielectric layer with the chemical mechanical polishing process may result in variations in the top surface of the dielectric layer such as bowing or having helixes of copper with interlaid dielectric in between. These variations may propagate up with the creation of additional layers.

Yet another issue is the problems associated with maintaining a proper vertical profile of the openings etched in the dielectric layer. Possible undesirable effects include bowing or sloping sidewalls, residues on the bottom surface of the opening or on top of the metal one layer. Serious challenges may also arise with photoresist removal, which changes the etching chemistry, which in turn may impact the vertical profile of the openings if the dielectric material being used is sensitive to the etching chemistry. A solution currently being used is to deposit a capping oxide layer on top of the dielectric layer subsequent to deposition of the dielectric layer, but that necessitates the inconvenience of having to deposit the capping oxide layer and to etch through the capping oxide.

Therefore, there are desired improved methods that allow for the formation of metallization layers in scaled down devices while avoiding the aforementioned problems associated with shrinking device size and using advanced materials such as copper and low-K dielectrics.

SUMMARY OF THE INVENTION

To achieve the foregoing and other objects and according to the purpose of the present invention, an improved method of forming a metallization layer in a layer stack is disclosed. In one embodiment of the invention, a method of performing a lithographic damascene etch through a layer stack to form a metal line is disclosed. The layer stack, which is disposed above a substrate, is comprised of an underlying layer. The method of performing the lithographic damascene etch comprises the steps of depositing a photoresist layer above the layer stack, forming a trench in the photoresist layer so that the trench is positioned over the underlying layer of the layer stack, depositing a metal layer over a top surface of the photoresist layer and filling the trench, planarizing the metal layer down to about a level of the top surface of the photoresist layer to define a top surface of a metal line, removing the photoresist layer leaving gaps around the metal line, and depositing a dielectric material to fill the gaps around the metal line up to about a level of the top surface of the metal line.

In another embodiment of the present invention, a method of performing a lithographic dual damascene etch through a layer stack to form a metal line substantially simultaneously with an electrical interconnect is disclosed. The layer stack is disposed above a substrate and is comprised of an underlying layer. The method comprises the steps of depositing a first photoresist layer above the layer stack, forming an opening in the first photoresist layer and positioning the opening over the underlying layer of the layer stack, depositing a second photoresist layer over the first photoresist layer and filling the opening, forming a trench in the second photoresist layer and a via underlying the trench through the first photoresist layer. The via is coincident with the opening formed earlier in the first photoresist layer, and the trench is aligned over the via such that a cross section of the via is completely disposed within a cross section of the trench. The process continues with the steps of depositing a metal layer over the top surface of the second photoresist layer and filling the trench and the via, planarizing the metal layer down to about a level of the top surface of the second photoresist layer to define a top surface of a metal line, removing the first and second photoresist layers to leaving gaps around the metal line and a metal plug underlying the metal line, and depositing a dielectric material to fill the gaps around the metal line and the metal plug underlying the metal line up to about the top surface of the metal line.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates to an improved method of performing a lithographic damascene etch through a layer stack. According to the invention, photoresist is used as a sacrificial layer in a lithographic single or dual damascene process to form a metallization layer by itself or substantially simultaneously with an electrical interconnection to an underlying device layer.

In one embodiment of the invention, a trench suitable for the deposition of metal is formed in the photoresist layer. In the described embodiment, an optional diffusion barrier layer then covers the top surface of the photoresist layer and the inner surface of the trench in preparation for the metal deposition, which then takes place over the diffusion barrier layer, filling the trench and continuing over the top surface of the photoresist layer. The diffusion barrier may be omitted in certain applications, for example, when diffusion of the deposited metal into the dielectric material is not an issue. The deposited metal is then planarized to about a level of the top surface of the photoresist layer to form a metal line, followed by the removal of the photoresist and the deposition of a dielectric material around the metal line to fill the gaps left by removal of the photoresist.

In another embodiment of the invention, a trench suitable for the deposition of metal is formed in a second photoresist layer. The trench is aligned with an underlying via which is formed through a first photoresist layer and connecting to an underlying layer. In the described embodiment, an opening is formed in a first photoresist layer. A second photoresist material is then deposited over the first photoresist layer to fill the opening earlier formed and to form a second photoresist layer overlying the first photoresist layer. A portion of the second photoresist is then removed to form a trench in the second photoresist layer and an underlying via that is coincident with the opening earlier formed through the first photoresist layer. This underlying via removes the second photoresist material that fills the opening earlier formed in the first photoresist layer during the deposition of the second photoresist layer. As a result, a trench in the second photoresist layer is now aligned with an underlying via in the first photoresist layer. Then a diffusion barrier layer may be formed over the top surface of the second photoresist layer and the inner surfaces of the trench and the underlying via, followed by deposition of metal to fill the trench and underlying via as well as over the top surface of a second photoresist layer. Again, the diffusion barrier layer may be omitted in certain situations where it is not needed. The deposited metal is then planarized to about a level of the top surface of the second photoresist layer to form a metal line having vias that connect down, followed by the removal of both photoresist layers, which leaves gaps around the metal line. These gaps are filled by depositing a dielectric material.

Figure 2:
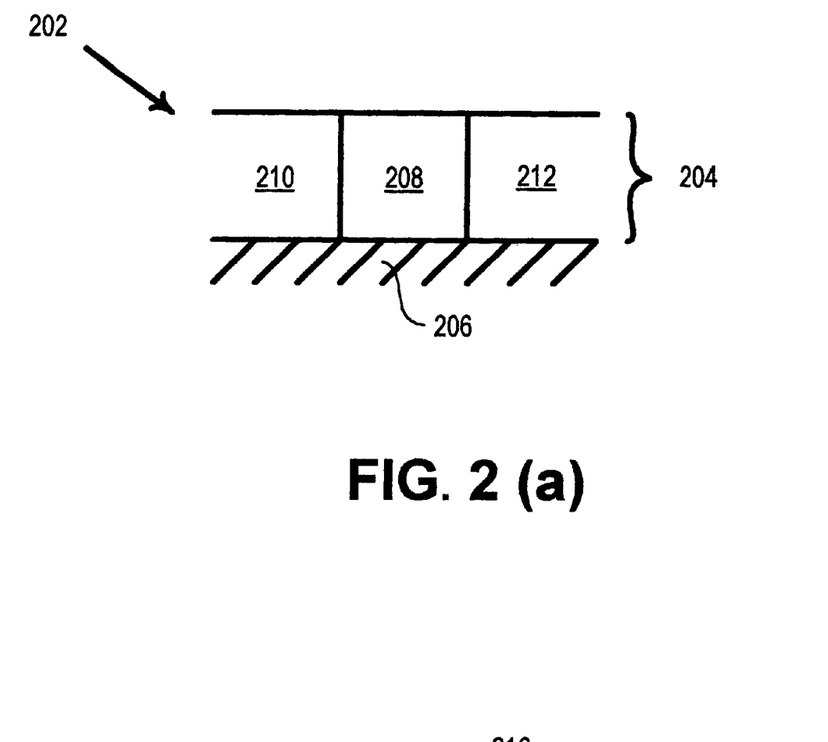
FIGS. 2(a), 2(b), 2(c), 2(d), 2(e), 2(f), 2(g) and 2(h) illustrate a process flow for forming a metallization layer according to a first embodiment of the present invention in a single damascene process.

FIGS. 2(a), 2(b), 2(c), 2(d), 2(e), 2(f), 2(g) and 2(h) illustrate a process flow for forming a metallization layer using an improved lithographic single damascene technique in accordance with one aspect of the present invention. FIG. 2(a) shows a layer stack 202 having a metal one layer 204 disposed above a substrate 206. A metal one region 208 may be a line or a via or a chain of vias in metal one layer 204. Dielectric regions 210 and 212 insulate metal one region 208 from other metal lines or vias. Though it is not shown in the figures, layer stack 202 may represent a layer within a series of layers and substrate 206 may have various processing and/or device layers disposed underneath. Note that although the present invention is discussed in the context of having a metal line or via coupled to an underlying metal one layer, the lithographic damascene process does not require that the underlying layer be a metal layer. In fact, any underlying layer or structure may be suitable for use with the inventive lithographic damascene process.

FIG. 2(b) shows a photoresist layer 214 that is formed over metal one layer 204. Photoresist layer 214 has been patterned using a conventional photolithography process to provide an opening 216. Standard types of polymers generally used as photoresist masks should have sufficient thermostability and vacuum stability to withstand the copper deposition process and development of the barrier layer. However, in some cases, the photoresist materials might require some toughening treatment such as deep UV or crosslinking that would enable them to withstand the standard types of temperature ranges normally used for copper deposition and developing the barrier layer (discussed later herein).

FIG. 2(c) shows an optional diffusion barrier layer 218 that is formed over and coats the top surface of the photoresist layer 214 as well as the inner surface of opening 216. One purpose of a diffusion barrier layer is to prevent the copper molecules or ions from leaking out into the dielectric material and forming impurities that might alter the properties of the dielectric material. Diffusion barrier layers are frequently employed in damascene processes using copper. Diffusion barrier layer 218 may comprise tantalum or tantalum nitride, and is typically deposited by a sputter deposition source, which is a reactive sputtering using a tantalum target and a nitrogen atmosphere. Barrier layers are typically deposited at a temperature of approximately 300° C., which may be incompatible with the use of photoresist material, which tends to flow at a temperature of about 120° C. However, the photoresist material may be stabilized by, for example, crosslinking so that it will not flow until it reaches about 200° C. Therefore, the deposition of the diffusion barrier layer is preferably conducted at a temperature below 200° C., more preferably at a temperature below 120° C. Although diffusion barrier layer 218 can be deposited at temperatures as low as −50° C., a balance needs to be achieved as there would be a throughput advantage in depositing diffusion barrier layer 218 at a higher temperature. In general, lower deposition temperatures tend to stabilize the photoresist to a greater degree while higher deposition temperatures tend to increase throughput for depositing the diffusion barrier layer.

FIG. 2(d) shows layer stack 202 after a metal two layer 220 has been deposited over diffusion barrier layer 218. Metal two layer 220 may comprise, for example, copper, aluminum, titanium, platinum, or one of their alloys. The metal two layer deposition fills up opening 216 and is disposed over the top surface of photoresist layer 214. Metal deposition can be accomplished at a temperature range wherein the photoresist does not flow or burn, but other factors might play a role in determining an optimal metal deposition temperature. Copper, for example, is optimally deposited by electrochemical deposition at lower temperatures of about −50° C. to avoid problems such as voiding, surface roughness, and agglomeration. An example of copper deposition technology is described in "Integration of Cu Electroplating Technology with Physical Vapor Deposition of Ta and Cu Seed Layers Using a Hollow Cathode Magnetron Plasma Source." by Klawuhn et. al. of Novellus Systems Inc., and is incorporated by reference.

Metal two layer 220 is then planarized down to the top surface of photoresist layer 214 to form a metal line 222, removing the portion of diffusion barrier layer 218 overlying the top surface of photoresist layer 214, leaving behind the portion of diffusion barrier layer 218 coating the inner surface of opening 216, as illustrated in FIG. 2(e). Planarization may be advantageously achieved by chemical mechanical polishing, which allows for application to any metal that can be abrasively and chemically polished away such as aluminum, copper, titanium, or the like. Since the photoresist layer is a sacrificial layer that will eventually be removed, it is immaterial what condition the top surface profile of the photoresist layer is in; the only requirement is to maintain a planar surface across the wafer as far as the top of the metal line is concerned.

FIG. 2(f) illustrates layer stack 202 after photoresist layer 214 has been removed by conventional methods, typically by a standard wet chemistry. Removal of the photoresist leaves gaps around metal line 222 previously occupied by photoresist layer 214.

FIG. 2(g) illustrates an optional step of depositing a cap layer 224 over metal line 222. Cap layer 224 may comprise of a silicon nitride, which may be deposited by chemical vapor deposition. Like diffusion barrier layer 218, cap layer 224 may be omitted if unneeded, for example, if diffusion of metal into the dielectric material is not an issue.

FIG. 2(h) shows layer stack 202 after a dielectric material has been deposited into the gaps around metal line 222, forming a dielectric layer 226. The dielectric layer may be deposited by a spin-on technique and may comprise a low-K dielectric material that is, by way of example, 100% organic and has good gap-fill properties. Two categories of the next generation materials include organic low-K materials, also termed as spin-on polymers, and aerogel low-K materials, also termed as spin-on foam. Examples of organic low-K dielectric materials include BCB and SiLK from Dow Chemicals of Midland, Mich. and FLARE from Allied Signal of Sunnyvale, Calif. BCB is a silicon-containing organic material, whereas SiLK and FLARE are 100% organic. Examples of aerogel low-K dielectric materials include nanoporous glass such as nanoglass from Allied Signal and xerogel from Texas Instruments of Dallas, Tex. These low-K dielectric materials have superior gap-fill properties and show excellent planarization across gaps as narrow as 0.1 µm. However, it should be noted that the invention is not limited to these materials and may employ any dielectric material that have suitable gap-filling properties.

Figure 3A:
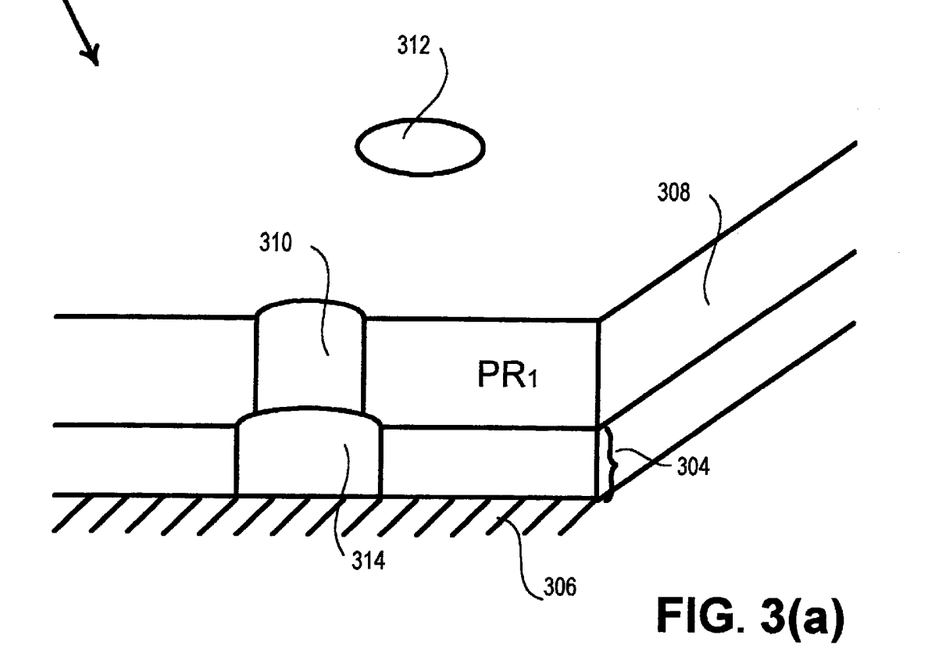
FIGS. 3(a), 3(b), 3(c), 3(d), 3(e), and 3(f) illustrate a process flow for forming a metallization layer according to a second embodiment of the present invention in a dual damascene process.

FIGS. 3(a), 3(b), 3(c), 3(d), 3(e) and 3(f) illustrate a simplified process flow for forming a metallization layer substantially simultaneously with an underlying via using an improved lithographic dual damascene technique in accordance with one aspect of the present invention. FIG. 3(a) shows a perspective representation of a layer stack 302 having a metal one layer 304 disposed above a substrate 306 and underlying a first photoresist layer 308. Exemplar openings 310 and 312 are formed in first photoresist layer 308 by conventional photolithography techniques. A metal one region 314 may be a line or a via or a chain of vias in metal one layer 304. Note that although the present invention is discussed in the context of having a metal line or via coupled to an underlying metal one layer, the lithographic damascene process does not require that the underlying layer be a metal layer. In fact, any underlying layer or structure may be suitable for use with the inventive lithographic damascene process. Though it is not shown in the figures, layer stack 302 may represent a layer within a series of layers and substrate 306 may have various processing and/or device layers disposed underneath.

Figure 3B:
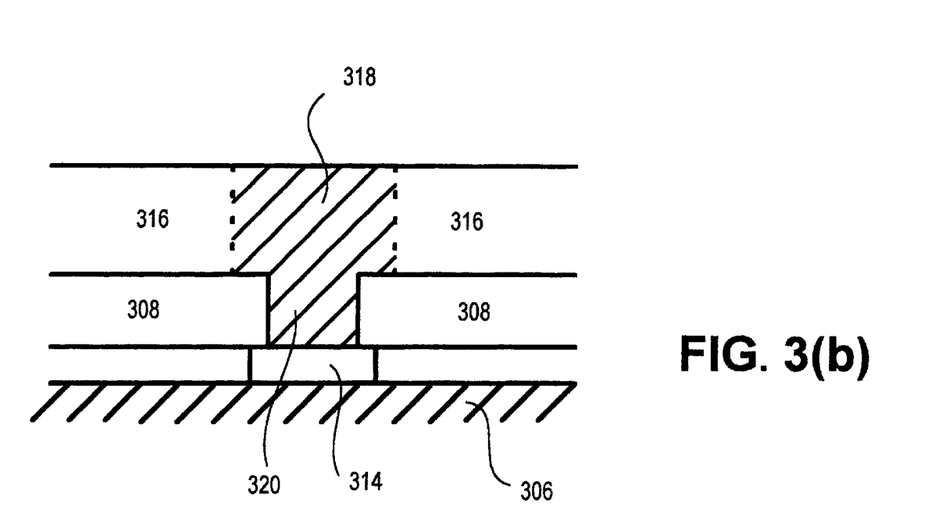

FIG. 3(b) illustrates a cross section of layer stack 302 after a second photoresist layer 316 is formed over first photoresist layer 308, filling exemplar openings 310 and 312. The first and second photoresist layers may respectively be a positive photoresist and a negative photoresist or vice versa. Using conventional photolithography techniques, a trench 318 is formed in second photoresist layer 316 along with an underlying via 320 in first photoresist layer 308. Via 320 is coincident with an opening that was initially formed through first photoresist layer 308 and subsequently filled with second photoresist layer material when second photoresist layer 316 is deposited over first photoresist layer 308. In using the term coincident, via 320 is coincident with the opening if there is an overlap between the via and the opening; there is no requirement that the via and the opening should have the same size, the same axis, or the same shape.

Figure 3C:
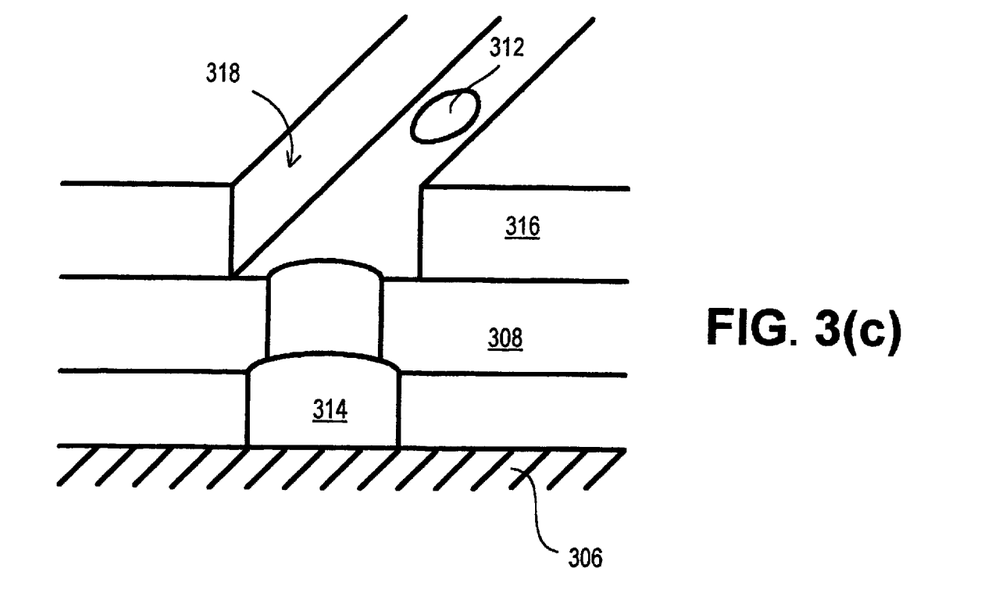

The removal of the second photoresist material may also be accomplished by two masks: a first mask to remove the second photoresist material in the via and a second mask to remove the material in the trench. Another alternative method of forming trench 318 with underlying via 320 is by depositing only one photoresist layer over layer 302, forming underlying via 320 to extend through the photoresist layer by exposing an unmasked first portion of the photoresist layer to a first intensity of light and forming trench 318 by exposing an unmasked second portion of the photoresist layer to a second intensity of light. The second intensity of light is less than the first intensity of light so that the resulting trench would have a depth that is less than a thickness of the photoresist layer. A perspective view of layer stack 302 corresponding to the cross sectional view of FIG. 3(b) is illustrated in FIG. 3(c).

Figure 3D:
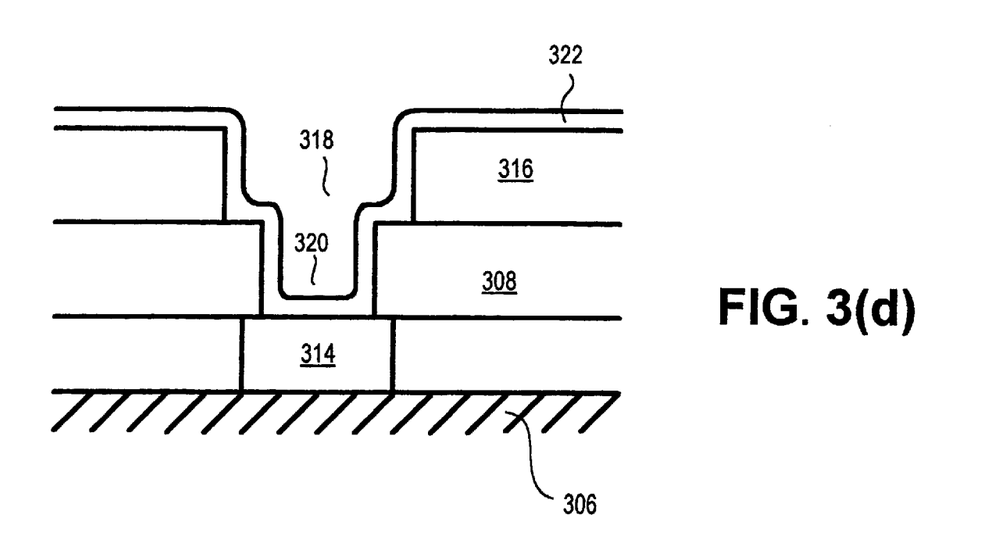

FIG. 3(d) shows an optional diffusion barrier layer 322 that is formed over and coats the top surface of second photoresist layer 316 as well as the inner surfaces of trench 318 and underlying via 320. As discussed earlier with the lithographic single damascene technique, diffusion barrier layer is preferably deposited at a temperature below which photoresist will flow or burn and may be omitted if unnecessary, for example, if diffusion of metal into the dielectric material is not an issue.

Figure 3E:
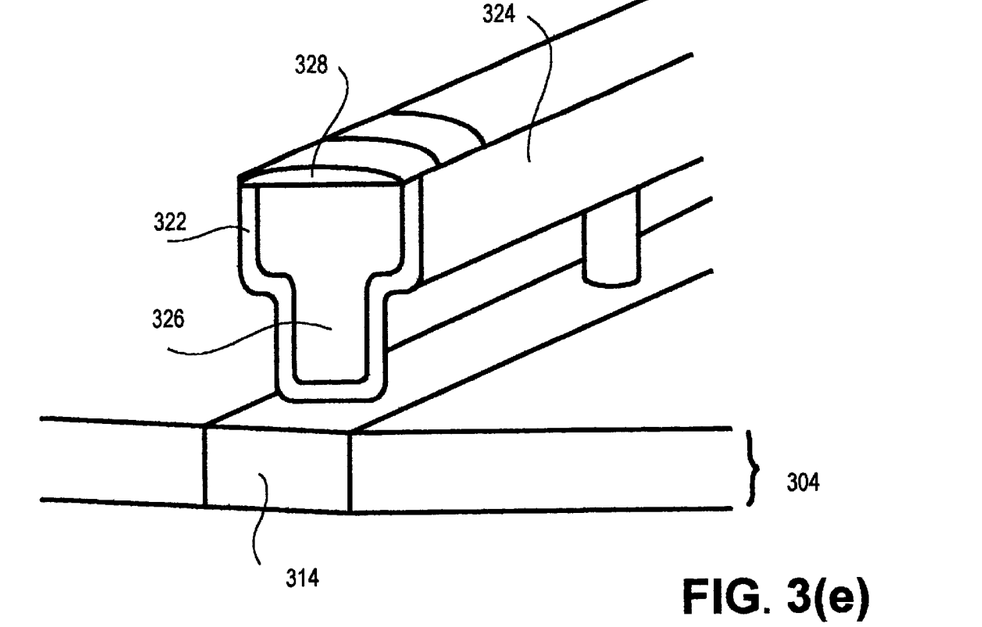
Figure 3F:
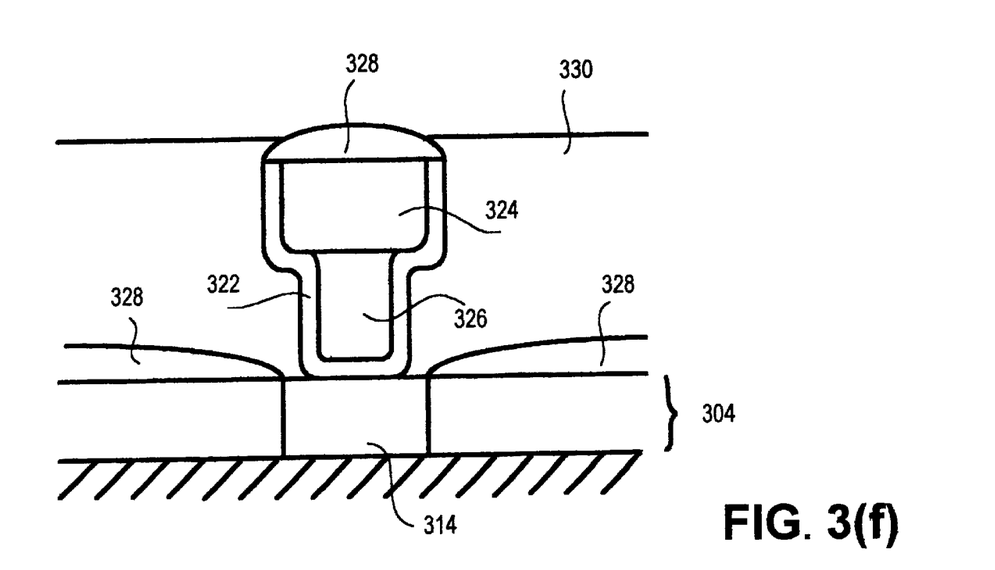

A metal two layer is then been deposited over diffusion barrier layer 322, filling up trench 318 and underlying via 320 as well as covering the top surface of second photoresist layer 316. The metal two layer may comprise, for example, copper, aluminum, titanium, platinum, or one of their alloys. The metal two layer is then planarized, by chemical mechanical polishing, for example, down to the top surface of second photoresist layer 316 to form a metal line 324 with an underlying metal contact 326. A portion of diffusion barrier layer 322 overlying the top surface of second photoresist layer 316 is removed, leaving behind the portion of diffusion barrier layer 322 coating the inner surfaces of trench 318 and underlying via 320. The photoresist layers 308 and 316 are then removed, using, e.g., a wet etch process, leaving gaps around metal line 324 and underlying metal contact 326. This is followed by the optional step of forming a capping layer 328 over the portions of the layer stack that are unshadowed from a top perspective, which translates into a discontinuous capping layer covering parts of metal line 324 and metal one layer 304. Like diffusion barrier layer 322, cap layer 328 may be omitted if unneeded, for example, if diffusion of metal into the dielectric material is not an issue. FIG. 3(e) shows a perspective view of the resulting structure prior to deposition of dielectric material into the gaps, which is a metal line 324 with a underlying metal contact 326 which is positioned over and in contact with metal one layer 304. FIG. 3(f) is a corresponding cross-sectional view of FIG. 3(e) after the dielectric layer 330 has been deposited into the gaps. Dielectric layer 330 may comprise any type of dielectric material, including low-K dielectrics, as long as it has good gap filling properties.

The improved lithographic damascene techniques have many inherent advantages which solves many of the problems encountered with earlier methods that relate to profile control and material properties, for example, metal etchability and the porosity and mechanical strength of the dielectric materials. The improved lithographic damascene technique advantageously defines vertical profiles through photolithography, a well-characterized process that is standard in the industry, which eliminates the concerns that arise from the etching of a dielectric layer such as the negative impact of photoresist removal as well as other possible undesirable effects such as bowing or sloping sidewalls or residues on the bottom surface of the opening or on top of the metal layer. The use of photoresist advantageously provides a smooth continuous surface for metal deposition, which eliminates the issue of material porosity. Moreover, photoresist is strong enough to withstand planarizing processes such as chemical mechanical polishing without shifting its profile and since the photoresist is a sacrificial layer that will eventually be removed, maintaining a smooth profile of the top surface is unnecessary. This method eliminates the concern regarding the use of dielectric materials that may not have sufficient mechanical strength to undertake such rigorous functions and allows for the use of spin-on dielectrics that are being considered for next generation damascene applications, thereby taking advantage of the excellent gap fill properties of these next generation materials. Furthermore, this improved technique also advantageously allows for the metal lines to define the dielectric features without the drawback of being limited to using etchable metals in the process.

Although the foregoing invention has been described in some detail for purposes of clarity of understanding, it will be apparent that certain changes and modifications may be practiced within the scope of the appended claims. For example, a seed metal layer may be deposited subsequent to the deposition of diffusion barrier layer and prior to the deposition of the metal two layer. Accordingly, the present embodiments are to be considered as illustrative and not restrictive, and the invention is not to be limited to the details given herein, but may be modified within the scope and equivalents of the appended claims.

What is claimed is:

1. A method of performing a lithographic damascene etch for forming a damascene metallization layer on a layer stack disposed above a substrate, said layer stack comprising an underlying layer, said method comprising:

depositing a photoresist layer above said layer stack;

forming a trench in said photoresist layer, said trench being positioned over said underlying layer of said layer stack, said trench extending down through said photoresist layer to said underlying layer;

depositing a metal layer over a top surface of said photoresist layer and filling said trench;

planarizing said metal layer down to about a level of said top surface of said photoresist layer to define a top surface of a metal line, thus leaving in said trench a portion of said metal layer, said portion being said metal line;

removing said photoresist layer, wherein said removing leaves gaps around said metal line, said gaps having been occupied by said photoresist layer before said removing; and depositing a dielectric material to fill said gaps around said metal line up to a level of about said top surface of said metal line.

2. The method of performing a lithographic damascene etch as in claim 1, further comprising depositing a diffusion barrier layer, said diffusion barrier layer forming a coating over said top surface of said photoresist layer and over an inner surface of said trench.

3. The method of performing a lithographic damascene etch as in claim 2, wherein said diffusion barrier layer comprises tantalum.

4. The method of performing a lithographic damascene etch as in claim 2, wherein said diffusion barrier layer comprises tantalum nitride.

5. The method of performing a lithographic damascene etch as in claim 2, wherein said diffusion barrier layer is deposited at a temperature below about 200° C.

6. The method of performing a lithographic damascene etch as in claim 2, wherein said diffusion barrier layer is deposited at a temperature below about 120° C.

7. The method of performing a lithographic damascene etch as in claim 1, wherein said metal layer comprises aluminum.

8. The method of performing a lithographic damascene etch as in claim 1 wherein said metal layer comprises copper.

9. The method of performing a lithographic damascene etch as in claim 8, wherein said copper is deposited at a temperature of about −50° C.

10. The method of performing a lithographic damascene etch as in claim 1, wherein said dielectric material comprises a low-K dielectric material.

11. The method of performing a lithographic damascene etch as in claim 10, wherein said low-K dielectric material comprises an organic low-K dielectric material.

12. The method of performing a lithographic damascene etch as in claim 10, wherein said low-K dielectric material comprises an aerogel low-K dielectric material.

13. The method of performing a lithographic damascene etch as in claim 12, wherein said aerogel low-K dielectric material comprises a nanoporous glass.

14. The method of performing a lithographic damascene etch as in claim 1, further comprising the step of forming a cap layer over said metal line and said layer stack prior to depositing said dielectric material to fill said gaps around said metal line.

15. The method of performing a lithographic damascene etch as in claim 14, wherein said cap layer comprises silicon nitride.

16. The method of performing a lithographic damascene etch as in claim 1 wherein said underlying layer comprises a metal one layer.

17. The method of performing a lithographic damascene etch as in claim 1, wherein aid depositing of said dielectric material is accomplished by a spin-on technique.

18. The method of performing a lithographic damascene etch as in claim 1, wherein said planarizing of said metal layer is accomplished by a chemical-mechanical polishing technique.

19. The method of performing a lithographic damascene etch as in claim 1, wherein said removing of said photoresist layer is accomplished by a wet etch technique.

20. The method of performing a lithographic damascene etch as in claim 1 wherein said substrate is employed in the manufacture of an integrated circuit.

21. The method of performing a lithographic damascene etch as in claim 1 wherein said substrate is employed in the manufacture of a dynamic random access memory.

22. A method of performing a lithographic dual damascene etch for forming a dual damascene metallization structure on a layer stack disposed above a substrate, said layer stack comprising an underlying layer, said method comprising:

depositing a first photoresist layer above said layer stack;

forming an opening in a top surface of said first photoresist layer, said opening being positioned over said underlying layer of said layer stack, said opening extending down through said first photoresist layer to said underlying layer;

depositing a second photoresist layer over said first photoresist layer and filling said opening;

forming a trench in a top surface of said second photoresist layer and a via underlying said trench through said first photoresist layer, said via being coincident with said opening, said trench being in communication with said via;

depositing a metal layer over said top surface of said second photoresist layer and filling said trench and said via;

planarizing said metal layer down to about a level of said top surface of said second photoresist layer to define a top surface of a metal line, wherein said planarizing leaves a portion of said metal layer in said trench and in said via, thus forming said metal line in said trench and forming, in said via, an underlying metal plug disposed below said metal line;

removing said first photoresist layer and said second photoresist layer, wherein said removing leaves gaps around said metal line and around said underlying metal plug disposed below said metal line; and depositing a dielectric material to fill said gaps around said metal line and around said underlying plug disposed below said metal line up to about said top surface of said metal line.

23. The method of performing a lithographic dual damascene etch as in claim 22, wherein said first photoresist layer comprises a positive photoresist and said second photoresist layer comprises a negative photoresist.

24. The method of performing a lithographic dual damascene etch as in claim 22, wherein said first photoresist layer comprises a negative photoresist and said second photoresist layer comprises a positive photoresist.

25. The method of performing a lithographic dual damascene etch as in claim 22, wherein said metal layer comprises aluminum.

26. The method of performing a lithographic dual damascene etch as in claim 22 wherein said metal layer comprises copper.

27. The method of performing a lithographic damascene etch as in claim 26, wherein said copper is deposited at a temperature of about −50° C.

28. The method of performing a lithographic dual damascene etch as in claim 22, wherein said dielectric material comprises a low-K dielectric material.

29. The method of performing a lithographic dual damascene etch as in claim 28, wherein said low-K dielectric material comprises an organic low-K dielectric material.

30. The method of performing a lithographic dual damascene etch as in claim 28, wherein said low-K dielectric material comprises an aerogel low-K dielectric material.

31. The method of performing a lithographic dual damascene etch as in claim 30, wherein said aerogel low-K dielectric material comprises a nanoporous glass.

32. The method of performing a lithographic dual damascene etch as in claim 22, further comprising the step of forming a cap layer over said metal line prior to said depositing of said dielectric material to fill said gaps around said metal line and said underlying metal plug disposed below said metal line.

33. The method of performing a lithographic dual damascene etch as in claim 32, wherein said cap layer comprises silicon nitride.

34. The method of performing a lithographic damascene etch as in claim 22 wherein said underlying layer comprises a metal one layer.

35. The method of performing a lithographic dual damascene etch as in claim 22, wherein said depositing of said dielectric material is accomplished by a spin-on technique.

36. The method of performing a lithographic dual damascene etch as in claim 22, wherein said planarizing of said metal layer is accomplished by a chemical-mechanical polishing technique.

37. The method of performing a lithographic dual damascene etch as in claim 22 wherein said substrate is employed in the manufacture of an integrated circuit.

38. The method of performing a lithographic dual damascene etch as in claim 22 wherein said substrate is employed in the manufacture of a dynamic random access memory.

39. The method of performing a lithographic damascene etch as in claim 22, further comprising the step of depositing a diffusion barrier layer, said diffusion barrier layer forming a coating over said top surface of said photoresist layer and over an inner surface of said trench.

40. The method of performing a lithographic damascene etch as in claim 39, wherein said diffusion barrier layer comprises tantalum.

41. The method of performing a lithographic damascene etch as in claim 39, wherein said diffusion barrier layer comprises tantalum nitride.

42. The method of performing a lithographic damascene etch as in claim 39, wherein said diffusion barrier layer is deposited at a temperature below about 200° C.

43. The method of performing a lithographic damascene etch as in claim 39, wherein said diffusion barrier layer is deposited at a temperature below about 120° C.

44. A method of performing a lithographic dual damascene etch on a layer stack disposed above a substrate, said layer stack comprising an underlying layer, said method comprising:

depositing a photoresist layer having a top surface above said layer stack;

forming a via in said photoresist layer by exposing an unmasked first portion of said photoresist layer to a first intensity of light, said via extending through said photoresist layer, said via being positioned over said underlying layer of said layer stack;

forming a trench in said photoresist layer by exposing an unmasked second portion of said photoresist layer to a second intensity of light, said second intensity of light being less than said first intensity of light such that said trench has a depth that is less than a thickness of said photoresist layer, said trench being in communication with said via:

depositing a metal layer over said top surface of said photoresist layer, said metal layer filling said trench and said metal layer filling said via to form an underlying metal plug in said via;

planarizing said metal layer down to about a level of said top surface of said photoresist layer to define a top surface of a metal line, said metal line being that portion of said metal layer that remains in said trench;

removing said photoresist layer, wherein said removing leaves gaps around said metal line and around said underlying metal plug disposed below said metal line, said gaps having been occupied by said photoresist layer before said removing; and depositing a dielectric material to fill said gaps around said metal line and said underlying plug disposed below said metal line up to a level of about said top surface of said metal line.

45. The method of performing a lithographic dual damascene etch as in claim 44, further comprising the step of forming a cap layer over said metal line prior to said depositing of said dielectric material to fill said gaps around said metal line and said underlying metal plug disposed below said metal line.

46. The method of performing a lithographic damascene etch as in claim 44, further comprising the step of depositing a diffusion barrier layer, said diffusion barrier layer forming a coating over said top surface of said photoresist layer and over an inner surface of said trench.

47. The method of performing a lithographic damascene etch as in claim 46, wherein said diffusion barrier layer comprises tantalum.

48. The method of performing a lithographic damascene etch as in claim 46, wherein said diffusion barrier layer comprises tantalum nitride.

49. The method of performing a lithographic damascene etch as in claim 46, wherein said diffusion barrier layer is deposited at a temperature below about 200° C.

50. The method of performing a lithographic damascene etch as in claim 46, wherein said diffusion barrier layer is deposited at a temperature below about 120° C.

51. The method of performing a lithographic damascene etch as in claim 44, wherein said metal layer comprises copper.

52. The method of performing a lithographic damascene etch as in claim 51, wherein said copper is deposited at a temperature of about −50° C.

* * * * *